US011089714B2

(12) United States Patent
Lin et al.

(10) Patent No.: US 11,089,714 B2
(45) Date of Patent: Aug. 10, 2021

(54) ELECTRONIC DEVICE AND ITS HEAT DISSIPATION ASSEMBLY

(71) Applicant: Quanta Computer Inc., Taoyuan (TW)

(72) Inventors: Ching-Ta Lin, Taoyuan (TW); Lu-Lung Tsao, Taoyuan (TW); Cheng-Chang Hung, Taoyuan (TW); Yu-Ching Tsai, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 16/857,581

(22) Filed: Apr. 24, 2020

(65) Prior Publication Data

US 2021/0195800 A1 Jun. 24, 2021

(30) Foreign Application Priority Data

Dec. 23, 2019 (TW) .................................. 108147249

(51) Int. Cl.
*H05K 7/20* (2006.01)
*H05K 1/02* (2006.01)

(52) U.S. Cl.
CPC ....... *H05K 7/20163* (2013.01); *H05K 1/0203* (2013.01); *H05K 7/2039* (2013.01); *H05K 7/20263* (2013.01)

(58) Field of Classification Search
CPC .......... H05K 7/20154–20163; H05K 7/20409; H05K 1/0203
See application file for complete search history.

(56) References Cited

U.S. PATENT DOCUMENTS

| 6,496,368 | B2 * | 12/2002 | Jui-Yuan | H01L 23/3672 165/121 |
| 6,691,427 | B1 * | 2/2004 | Fernandes | E04B 1/7015 34/103 |
| 10,238,004 | B2 * | 3/2019 | Baran | F04D 29/601 |
| 10,390,456 | B2 * | 8/2019 | Baran | F04D 29/601 |
| 10,912,233 | B2 * | 2/2021 | Baran | H05K 7/20145 |
| 10,912,234 | B2 * | 2/2021 | Baran | H05K 1/0203 |
| 2009/0323274 | A1 * | 12/2009 | Lin | G06F 1/183 361/679.48 |

(Continued)

FOREIGN PATENT DOCUMENTS

| CN | 206480615 U | 9/2017 |
| CN | 208210534 U | 12/2018 |

(Continued)

*Primary Examiner* — Robert J Hoffberg

(57) ABSTRACT

A heat dissipation assembly includes a bottom plate, an outer cover, a heat guiding base, a flow-acceleration unit and two side cover sets. The bottom loads a heat-generating source. The outer cover includes a cover body and two slots. The cover body covers the bottom plate to define an accommodation space therebetween, and the slots are oppositely formed on the cover body and connected to the accommodation space. The heat guiding base thermally contacts the heat-generating source and the cover body, and is formed with voids arranged alongside, each of the voids is communication with the slots respectively. The side cover sets are disposed within the slots, respectively, and detachably connected to the cover body and the heat guiding base. The flow-acceleration unit is disposed in one of the side cover sets to lead a fluid to the other through the voids.

9 Claims, 7 Drawing Sheets

(56) References Cited

U.S. PATENT DOCUMENTS

2021/0011534 A1* 1/2021 Yin .................... B60H 1/00
2021/0059075 A1* 2/2021 Mitsui ................ H05K 7/20418

FOREIGN PATENT DOCUMENTS

| TW | 526963 U | 4/2003 |
| TW | M295282 U | 8/2006 |
| TW | 200813693 A | 3/2008 |

* cited by examiner

ELECTRONIC DEVICE AND ITS HEAT DISSIPATION ASSEMBLY

RELATED APPLICATIONS

This application claims priority to Taiwan Application Serial Number 108147249, filed Dec. 23, 2019, which is herein incorporated by reference.

BACKGROUND

Field of Disclosure

The disclosure relates to a heat dissipation assembly. More particularly, the disclosure relates to a heat dissipation assembly using a tunnel-type heat dissipation module.

Description of Related Art

Many internal components of a computer will generate a large amount of thermal energy during operation, so reliable heat dissipation services are critical factor to determine the performance and reliability of the computer. For example, the heat dissipation problem of the central processing unit (CPU) or/and graphics processing unit (GPU) with the highest workload is the most difficult. In addition, the above-mentioned internal component heat dissipation services also attach great importance to waterproof measures to reduce the chance of short-circuit failure caused by the internal components affected by moisture.

However, after repair/replacement or reassembly of parts in a heat dissipation facility, it often results in a reduction or loss of water resistance, thereby increasing the chance of internal components causing short-circuit failures.

SUMMARY

One aspect of the present disclosure is to provide an electronic device and its heat dissipation assembly for enhancing heat dissipation efficiency.

One aspect of the present disclosure is to provide an electronic device and its heat dissipation assembly to solve the aforementioned problems of the prior art.

In one embodiment of the disclosure, the heat dissipation assembly includes a bottom plate, an outer cover, a heat guiding base, a first side cover set, a second side cover set and at least one first flow-acceleration unit. The bottom plate is used to load a heat-generating source. The outer cover includes a cover body, a first slot and a second slot. The cover body covers one surface of the bottom plate so that an accommodation space is mutually defined between the cover body and the bottom plate. The first slot and the second slot are respectively formed on two opposite sides of the cover body, and are in communication with the accommodation space. The heat guiding base thermally contacts the heat-generating source and the cover body, and is formed with a plurality of voids. The voids are arranged alongside, and each of the voids is communication with the first slot and the second slot. The first side cover set is disposed within the first slot, and detachably connected to the cover body and the heat guiding base. The second side cover set is disposed within the second slot, and detachably connected to the cover body and the heat guiding base. The first side cover set is formed with a first passage, and the second side cover set is formed with a second passage. The first flow-acceleration unit is disposed in the first passage for leading a fluid to the second passage from the first side cover set through the voids.

In one or more embodiments, in the foregoing heat dissipation assembly, the first slot includes a first recessed portion and a first opening. The first recessed portion is formed on one of the two opposite sides of the cover body. The first opening is arranged within the first recessed portion, connected to the accommodation space and the first passage. The first side cover set is totally embedded in the first recessed portion, and the first passage is communication with the accommodation space via the first opening.

In one or more embodiments, in the foregoing heat dissipation assembly, the heat guiding base includes a base portion, a top cover portion, a fin set and two fixing portions. One surface of the base portion is directly connected to the heat-generating source. The top cover portion covers the other surface of the base portion, and is directly connected to the cover body. The fin set includes a plurality of fins which are straightly and arranged abreast on the other surface of the base portion so that the base portion, the top cover portion and the fins mutually define the voids which are arranged alongside. Each of the voids is communication with the first passage and the second passage. The fixing portions are respectively formed on two opposite ends of the fin set for fixing the first side cover set and the second side cover set on the fin set, respectively.

In one or more embodiments, in the foregoing heat dissipation assembly, the first side cover set includes a first support frame, a first elastic inner cushion, a first ventilation cover and a first elastic outer cushion. The first support frame is fixed on one side of the heat guiding base, and formed with at least one receiving zone for receiving the first flow-acceleration unit. The first elastic inner cushion is directly sandwiched between the first support frame and the heat guiding base. The first ventilation cover is fixed on the first flow-acceleration unit and the cover body. The first elastic outer cushion is directly sandwiched between the first ventilation cover and the first support frame.

In one or more embodiments, in the foregoing heat dissipation assembly, the first support frame includes a frame body and an extending portion. The frame body is disposed between the first elastic outer cushion and the first elastic inner cushion. The receiving zone is concavely formed on the frame body. The extending portion includes a main body, an abutting surface and a guiding sloping surface. The main body is connected to one surface of the frame body facing towards the heat guiding base. The abutting surface is located on one surface of the main body facing away from the receiving zone for abutting the first elastic inner cushion. The guiding sloping surface is located on one surface of the main body facing towards the receiving zone for leading the fluid in the first passage to the voids.

In one or more embodiments, in the foregoing heat dissipation assembly, the outer cover includes a narrow groove and a through hole. The narrow groove is formed on one surface of the cover body facing away from the bottom plate. The through hole is formed within the narrow groove, and connected to the narrow groove and the accommodation space. The first flow-acceleration unit includes a power supply wire passing through the through hole to be limited in the narrow groove.

In one or more embodiments, the foregoing heat dissipation assembly further includes at least one second flow-acceleration unit. The second flow-acceleration unit is disposed in the second passage of the second side cover set for leading the fluid in the voids to the second side cover set.

In one embodiment of the disclosure, the electronic device includes a bottom plate, an outer cover, a heat-generating source, a tunnel-type heat dissipation module and a fluid providing device. The outer cover includes a cover body, a first slot and a second slot. The cover body covers one surface of the bottom plate so that an accommodation space is mutually defined between the cover body and the bottom plate. The first slot and the second slot are respectively formed on two opposite sides of the cover body, and in communication with the accommodation space. The heat-generating source disposed in the accommodation space, and fixedly disposed on the surface of the bottom plate. The tunnel-type heat dissipation module is disposed in the accommodation space, the first slot and the second slot, and is thermally connected to the heat-generating source. The fluid providing device is air-tightly connected to the first slot and the second slot through guide pipes for leading a fluid to the tunnel-type heat dissipation module, and receives the fluid returned from the tunnel-type heat dissipation module.

In one or more embodiments, in the foregoing electronic device, the tunnel-type heat dissipation module further includes a heat guiding base, a first side cover set, a second side cover set and at least one first flow-acceleration unit. The heat guiding base is thermally connected to the heat-generating source and the cover body, and formed with a plurality of voids which are arranged alongside. Each of the voids is independently communicated with the first slot and the second slot, and hermetically isolated from the heat-generating source. The first side cover set is disposed within the first slot, and detachably connected to the cover body and the heat guiding base. The first side cover set is formed with a first passage. The second side cover set is disposed within the second slot, and detachably connected to the cover body and the heat guiding base. The second side cover set is formed with a second passage. The first flow-acceleration unit is disposed in the first passage for leading the fluid to the second passage from the first side cover set through the voids.

In one or more embodiments, in the foregoing electronic device, the heat guiding base includes a base portion, a top cover portion, a fin set and two fixing portions. One surface of the base portion is directly connected to the heat-generating source. The top cover portion covers the other surface of the base portion, and is directly connected to the cover body. The fin set includes a plurality of fins which are straightly and arranged abreast on the other surface of the base portion so that the base portion, the top cover portion and the fins mutually define the voids which are arranged alongside. Each of the voids is communication with the first passage and the second passage. The fixing portions are respectively formed on two opposite ends of the fin set for fixing the first side cover set and the second side cover set on the fin set, respectively.

Therefore, through the construction of the embodiments above, the disclosure will not weaken or lose the waterproof function on the foregoing electronic device after repair/replacement, thereby the possibilities of the heat-generating source getting short-circuited is reduced.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
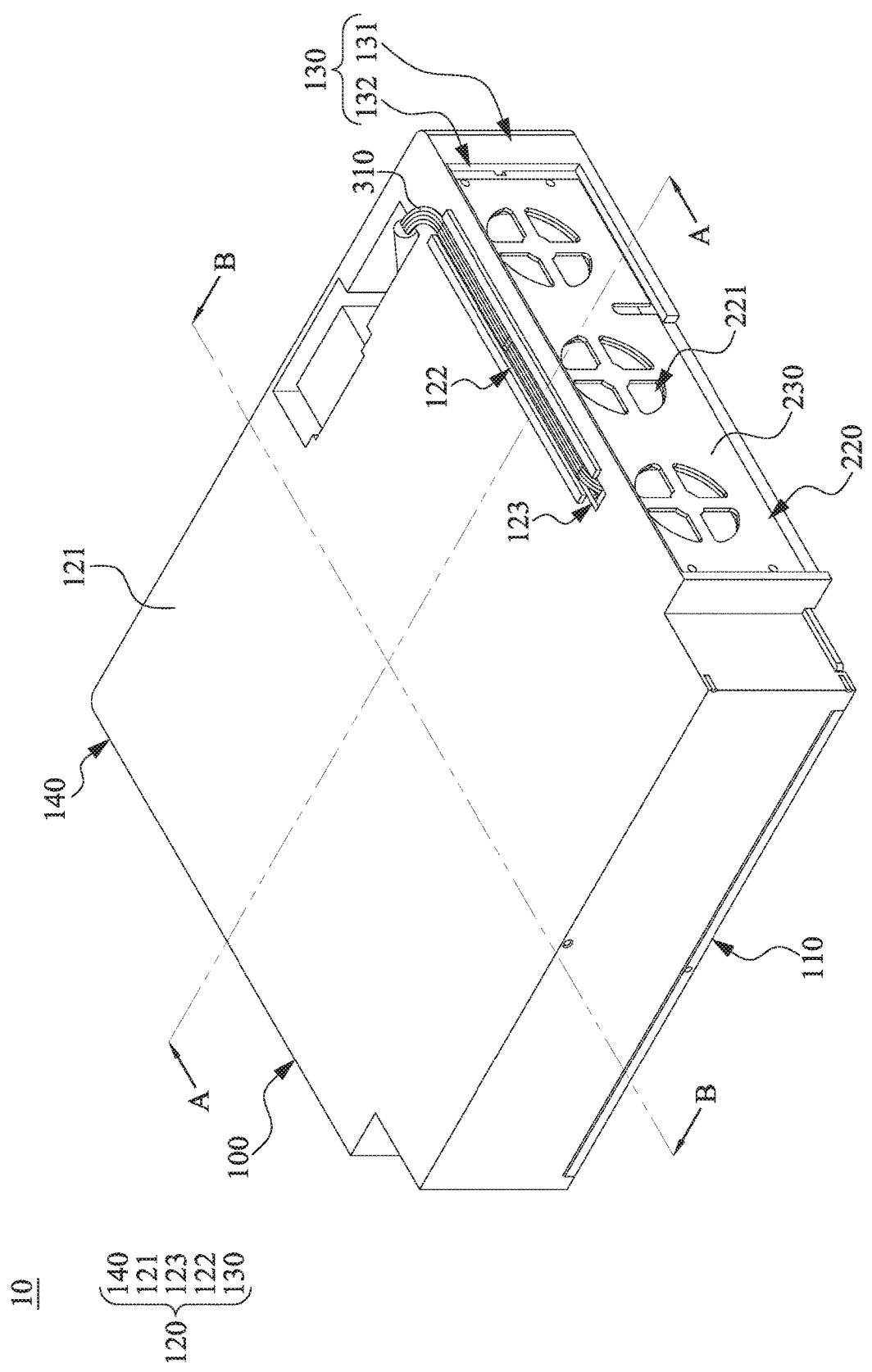
FIG. 1 is a perspective view of an electronic device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
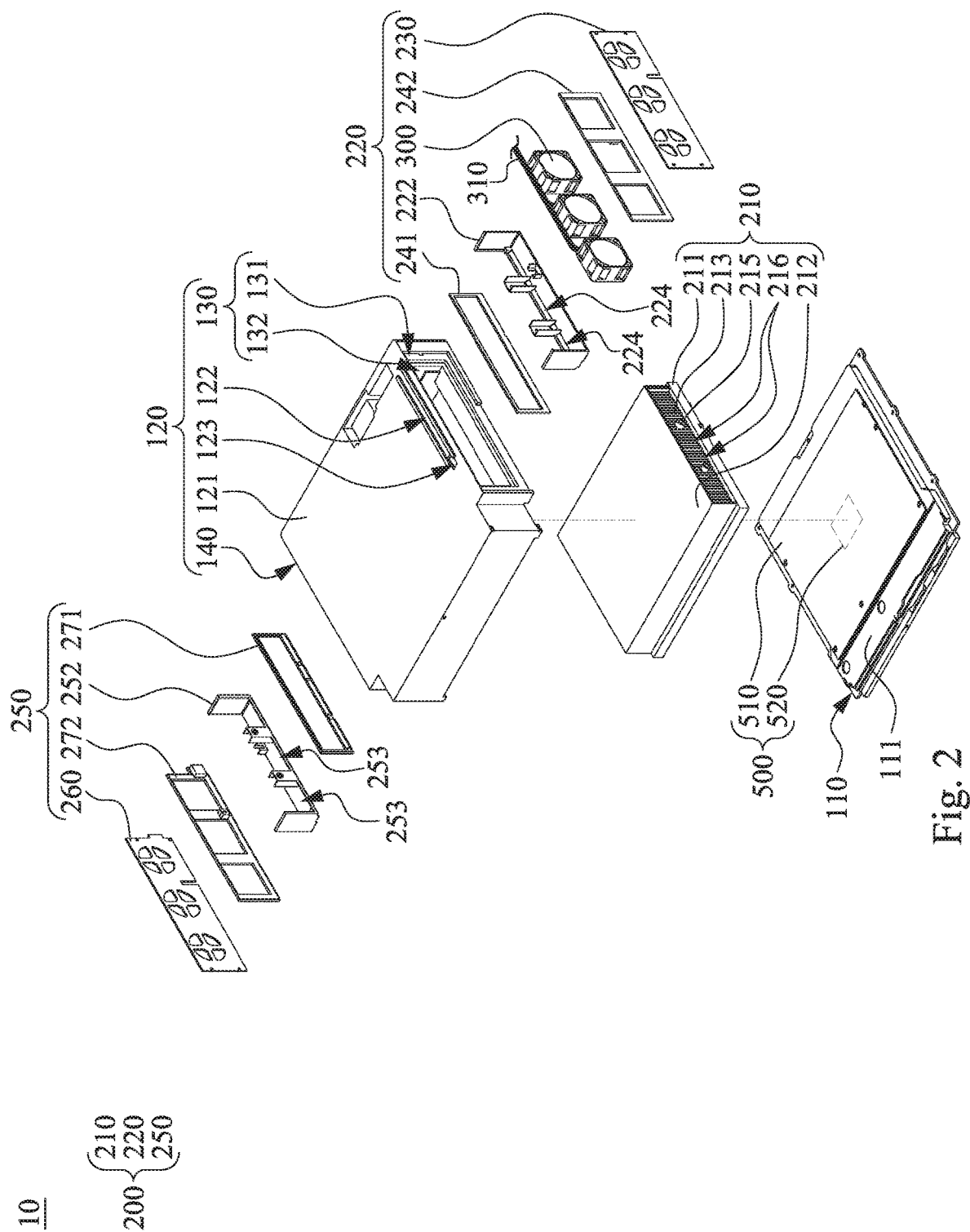
FIG. 2 is an exploded view of the electronic device of FIG. 1.
Figure 3A:
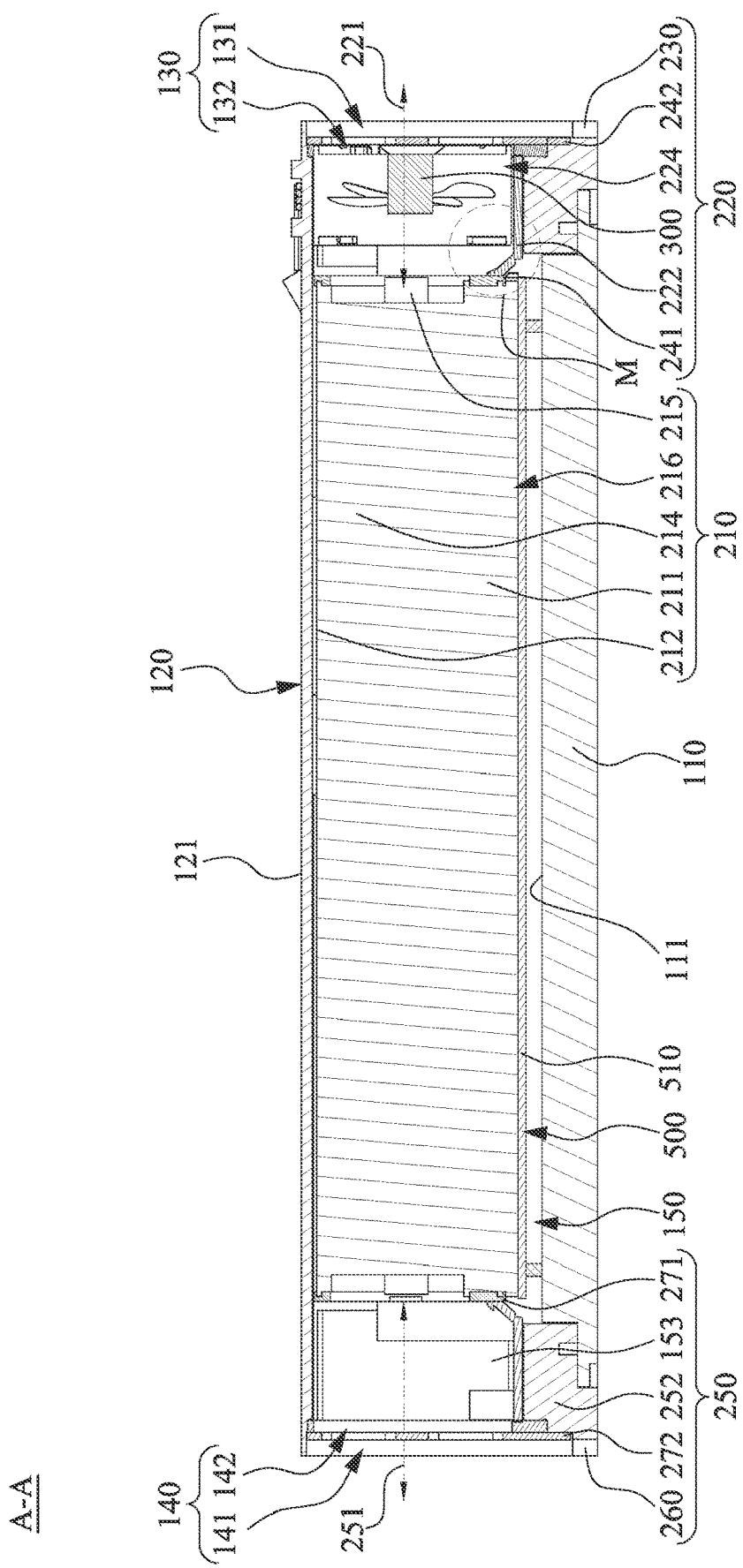
FIG. 3A is a sectional view of the electronic device taken along a line AA of FIG. 1.

Reference is now made to FIG. 1 and FIG. 3A, in which FIG. 1 is a perspective view of an electronic device 10 according to one embodiment of the disclosure, FIG. 2 is an exploded view of the electronic device 10 of FIG. 1, and FIG. 3A is a sectional view of the electronic device 10 taken along a line AA of FIG. 1. As shown in FIG. 1 to FIG. 3A, in this embodiment, the electronic device 10 includes a heat dissipation assembly 100 and a heat-generating source 500. The heat dissipation assembly 100 includes a bottom plate 110, an outer cover 120 and a tunnel-type heat dissipation module 200. The outer cover 120 includes a cover body 121, a first slot 130 and a second slot 140. The cover body 121 covers a top surface 111 of the bottom plate 110 so that an accommodation space 150 is mutually defined between the cover body 121 and the cover body 121. The first slot 130 and the second slot 140 are respectively formed on two opposite sides of the cover body 121, and are in communication with the accommodation space 150. The heat-generating source 500 is disposed in the accommodation space 150, and is fixed on the top surface 111 of the bottom plate 110.

The tunnel-type heat dissipation module 200 is disposed within the accommodation space 150, the first slot 130 and the second slot 140, and thermally connected to the heat-generating source 500. In the embodiment, the tunnel-type heat dissipation module 200 further includes a heat guiding base 210, a first side cover set 220, a second side cover set 250 and a plurality of first flow-acceleration units 300. The heat guiding base 210 is thermally connected to the heat-generating source 500, in other words, the heat-generating source 500 is directly sandwiched between the heat guiding base 210 and the bottom plate 110 so that the thermal energy of the thermal heat-generating source 500 is guided to the heat guiding base 210. For example, the heat guiding base 210 respectively contacts the heat-generating source 500 and the cover body 121, and the heat-guiding base 210 is formed with a plurality of voids 216 which are arranged alongside.

Each of the voids 216 is independently communicated with the first slot 130 and the second slot 140, and hermetically isolated from the heat-generating source 500. The first side cover set 220 is disposed within the first slot 130, and detachably connected to the cover body 121 and the heat guiding base 210. The first side cover set 220 is formed with a first passage 221. The second side cover set 250 is disposed within the second slot 140, and detachably connected to the cover body 121 and the heat guiding base 210. The second side cover set 250 is formed with a second passage 251. The first flow-acceleration units 300 are disposed in the first passage 221 of the first side cover set 220 for leading fluid (e.g., air, water, oil, etc.) to the second passage 251 of the second side cover set 250 from the first side cover set 220 through the voids 216. Each of the first flow-acceleration units 300, for example is a fan or a propeller, etc.

Therefore, through the construction of the embodiments above, the disclosure will not weaken or lose the waterproof function on the foregoing electronic device 10 after repair/replacement, thereby the possibilities of the heat-generating source 500 getting short-circuited is reduced.

Specifically, the first slot 130 includes a first recessed portion 131 and a first opening 132. The first recessed portion 131 is formed on one side of the cover body 121. The first opening 132 is arranged within the first recessed portion 131, and connected to the accommodation space 150 and the first passage 221. The first side cover set 220 is totally embedded in the first recessed portion 131, and the first passage 221 is communication with the accommodation space 150 via the first opening 132. The second slot 140 includes a second recessed portion 141 and a second opening 142. The second recessed portion 141 is formed on the other side of the cover body 121. The second opening 142 is arranged within the second recessed portion 141, and connected to the accommodation space 150 and the second passage 251. The second side cover set 250 is totally embedded in the second recessed portion 141, and the second passage 251 is communication with the accommodation space 150 via the second opening 142. In the embodiment, the cover body 121 is made of, for example, a hard material, such as metal or plastic. However, the disclosure is not limited thereto.

For example, the first side cover set 220 includes a first support frame 222, a first ventilation cover 230, a first elastic inner cushion 241 and a first elastic outer cushion 242. The first support frame 222 is fixed on one side of the heat guiding base 210, and the first support frame 222 is formed with a plurality of receiving zones 224. Each of the receiving zones 224 is used to receive one of the first flow-acceleration units 300. The first elastic inner cushion 241 is directly sandwiched between the first support frame 222 and the heat guiding base 210. The first ventilation cover 230 is screwedly fixed on the first flow-acceleration units 300 and the cover body 121. The first elastic outer cushion 242 is directly sandwiched between the first ventilation cover 230 and the first support frame 222. After the first ventilation cover 230, the first elastic outer cushion 242, the first support frame 222 and the first elastic inner cushion 241 are combined together, the aforementioned first passage 221 is therefore formed in the first ventilation cover 230, the first elastic outer cushion 242, the first support frame 222 and the first elastic inner cushion 241. For example, the first elastic inner cushion 241 and the first elastic outer cushion 242 are made of material with water-proof and elastic characteristics, such as rubber or silicone. However, the disclosure is not limited thereto.

In this way, since the first elastic inner cushion 241 is directly sandwiched between the first support frame 222 and the heat guiding base 210, when a user would like to repair or replace one of the first flow-acceleration units 300, even if parts are repaired/replaced or reassembled, the waterproof function of the first side cover set 220 will not be weakened or lost due to the blocking of the first elastic inner cushion 241. That is, the fluid (e.g., air, water, oil, etc.) is still not leaked to the heat-generating source 500 from a position between the first support frame 222 and the heat guiding base 210.

In addition, in this embodiment, the external surface of the heat guiding base 210 further includes a positioned-limited structure formed with a concave-convex shape (FIG. 3B), so that the first elastic inner cushion 241 can be matchingly positioned thereon for strengthening the anti-permeability performance.

The second side cover set 250 includes a second support frame 252, a second ventilation cover 260, a second elastic inner cushion 271 and a second elastic outer cushion 272. The second support frame 252 is fixed on the other side of the heat guiding base 210. The second elastic inner cushion 271 is directly sandwiched between the second support frame 252 and the heat guiding base 210. The second elastic outer cushion 272 is directly sandwiched between the second ventilation cover 260 and the second support frame 252. The second ventilation cover 260 is screwedly fixed on the cover body 121. After the second ventilation cover 260, the second elastic outer cushion 272, the second support frame 252 and the second elastic inner cushion 271 are combined together, the aforementioned second passage 251 is therefore formed in the second ventilation cover 260, the second elastic outer cushion 272, the second support frame 252 and the second elastic inner cushion 271. For example, the second elastic inner cushion 271 and the second elastic outer cushion 272 are made of material with water-proof and elastic characteristics, such as rubber or silicone. However, the disclosure is not limited thereto.

In this way, since the second elastic inner cushion 271 is directly sandwiched between the second support frame 252 and the heat guiding base 210, when a user would like to repair or replace the second side cover set 250, even if parts are repaired/replaced or reassembled, the waterproof function of the second side cover set 250 will not be weakened or lost due to the blocking of the second elastic inner cushion 271. That is, the fluid (e.g., air, water, oil, etc.) is still not leaked to the heat-generating source 500 from a position between the second support frame 252 and the heat guiding base 210.

In addition, in this embodiment, the external surface of the heat guiding base 210 further includes a positioned-limited structure formed with a concave-convex shape (FIG. 3B), so that the second elastic inner cushion 271 can be matchingly positioned thereon for strengthening the anti-permeability performance.

As shown in FIG. 1 and FIG. 2, the outer cover 120 further includes a narrow groove 122 and a through hole 123. The narrow groove 122 is formed on one surface of the cover body 121 facing away from the bottom plate 110. The through hole 123 is formed within the narrow groove 122, and connected to the narrow groove 122 and the corresponding receiving zone 224. The first flow-acceleration unit 300 includes a power supply wire 310 passing through the through hole 123 to be limited in the narrow groove 122 in order to reduce the possibilities of the power supply wire 310 being unexpectedly shaken to be damaged.

Figure 3B:
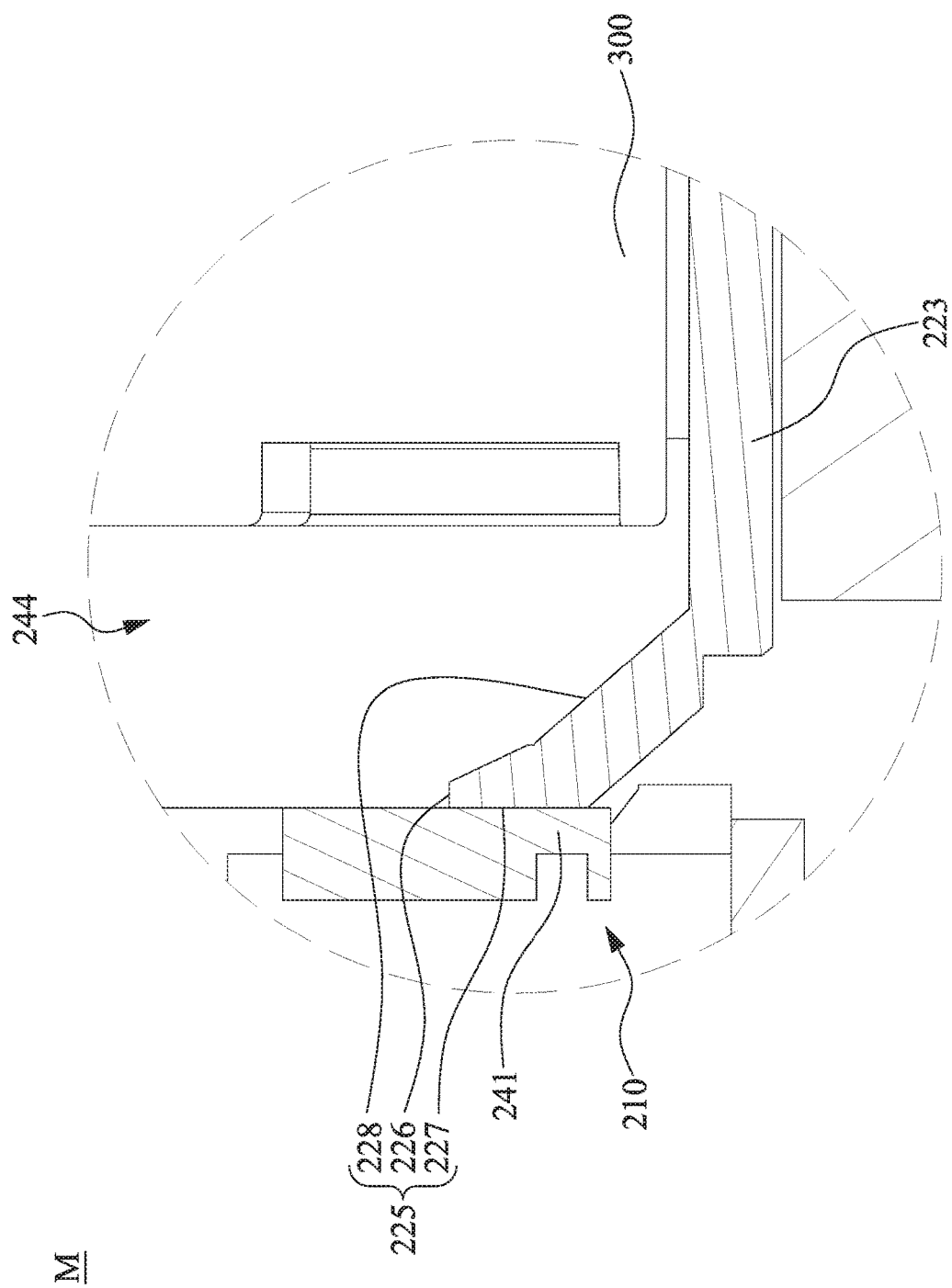
FIG. 3B is a partial enlarged view of an area M of FIG. 3A.
Figure 4:
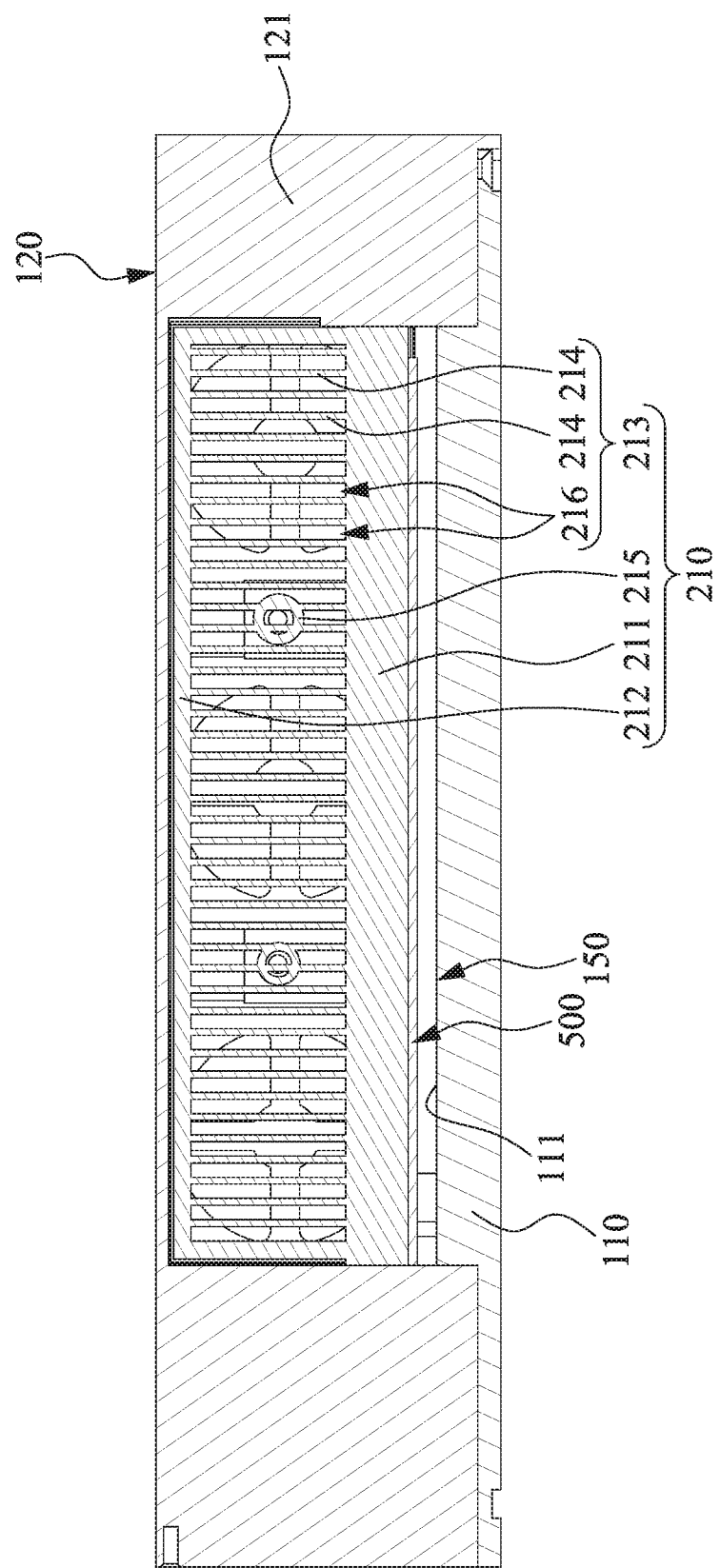
FIG. 4 is a sectional view of the electronic device taken along a line BB of FIG. 1.

FIG. 3B is a partial enlarged view of an area M of FIG. 3A, and FIG. 4 is a sectional view of the electronic device 10 taken along a line BB of FIG. 1. As shown in FIG. 2 and FIG. 4, the heat guiding base 210 includes a base portion 211, a top cover portion 212, a fin set 213 and two fixing portions 215. One surface of the base portion 211 is directly connected to the heat-generating source 500. The top cover portion 212 covers the other surface of the base portion 211, and is directly connected to the cover body 121. The fin set 213 includes a plurality of fins 214. Each of the fins 214 is shaped as a straight plate. The fins 214 are straightly and arranged abreast on the other surface of the base portion 211 so that the base portion 211, the top cover portion 212 and the fins 214 collectively define the aforementioned voids 216 which are arranged alongside. Each of the voids 216 is communication with the first passage 221 and the second passage 251. The fixing portions 215 are respectively formed on two opposite ends of the fin set 213 for fixing the first side cover set 220 and the second side cover set 250 on the fin set 213, respectively. In this embodiment, the heat guiding base 210 is made of, for example, a highly thermally conductive material, such as metal, however the disclosure is not limited thereto.

Also, as shown in FIG. 3A and FIG. 3B, the first support frame 222 includes a frame body 223 and an extending portion 225. The frame body 223 is disposed between the first elastic outer cushion 242 and the first elastic inner cushion 241. The receiving zone 224 is concavely formed on the frame body 223. The extending portion 225 includes a main body 226, an abutting surface 227 and a guiding sloping surface 228. The main body 226 is connected to one surface of the main body 226 facing towards the heat guiding base 210. The abutting surface 227 is located on one surface of the main body 226 facing away from the receiving zone 224 for abutting the first elastic inner cushion 241. The guiding sloping surface 228 is located on one surface of the main body 226 facing towards the receiving zone 224 for leading the fluid in the first passage to the voids 216. In this way, through the guiding function of the guiding sloping surface 228, a fluid (e.g., air, water, oil, etc.) can be efficiently guided to the voids 216, thereby further enhancing the heat dissipation capability of the fin set 213.

Figure 5:
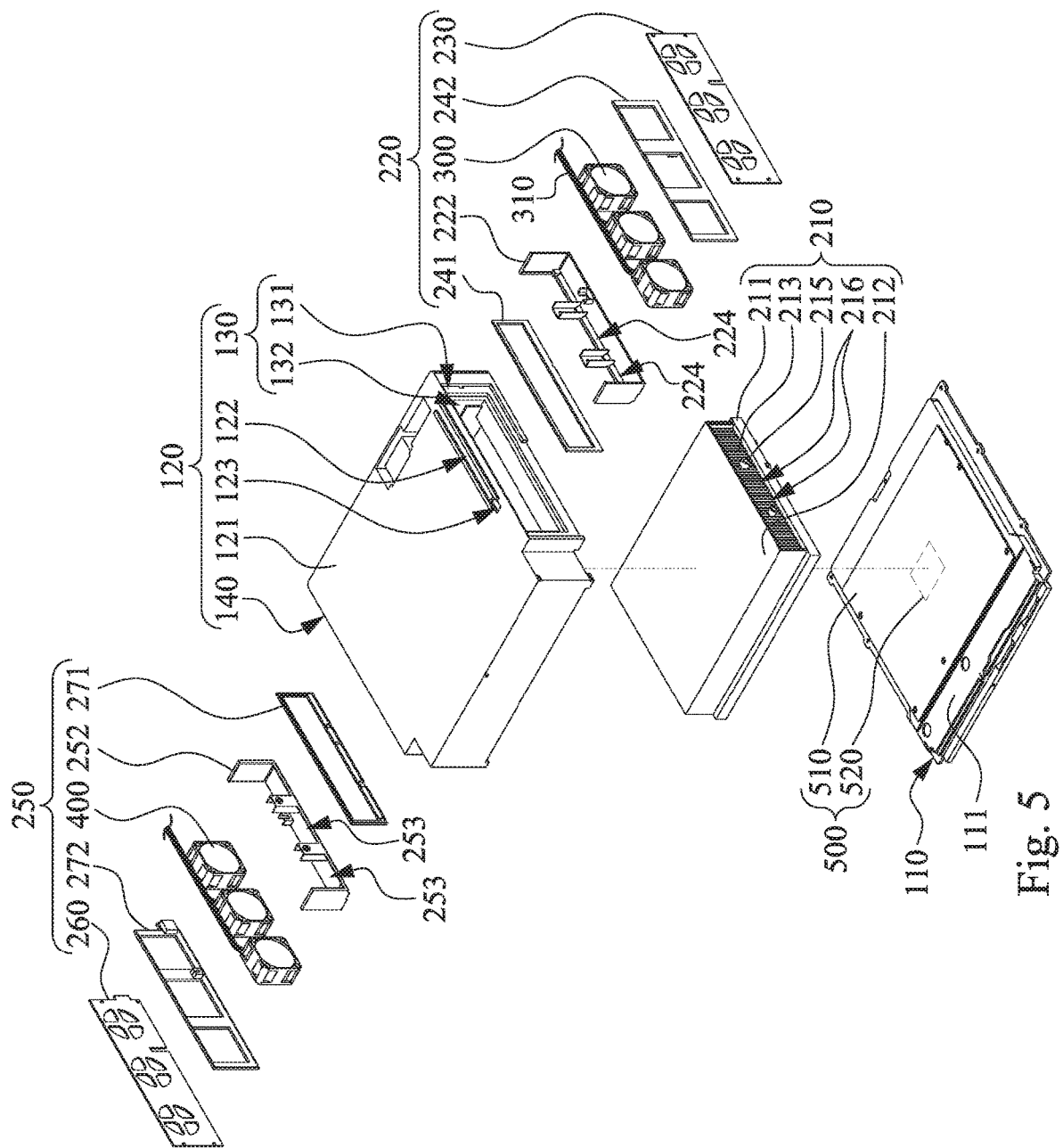
FIG. 5 is an exploded view of the electronic device according to one embodiment of the disclosure.

FIG. 5 is an exploded view of the electronic device 11 according to one embodiment of the disclosure. As shown in FIG. 5, the electronic device 11 of the embodiment is substantially the same to the electronic device 10 of the aforementioned embodiment. However, at least one difference of the electronic device 11 of the embodiment from the electronic device 10 is that, the electronic device 11 further includes a plurality of second flow-acceleration units 400. The second flow-acceleration units 400 are disposed in the second passage 251. Specifically, the second flow-acceleration units 400 are disposed on the second support frame 252 of the second side cover set 250 for leading the fluid from the voids to the second side cover set, and sending the fluid out of the second side cover set 250. The second support frame 252 is formed with a plurality of receiving zones 253. Each of the receiving zones 253 is used to receive one of the second flow-acceleration units 400. The second ventilation cover 260 is screwedly fixed on the second flow-acceleration units 400 and the cover body 121. Each of the second flow-acceleration units 400, for example is a fan or a propeller, etc. The second support frame 252 also includes an extending portion which is structural similar to the extending portion 225 of the first support frame 222, therefore, the description of the extending portion of the second support frame 252 will not be repeated again.

Figure 6:
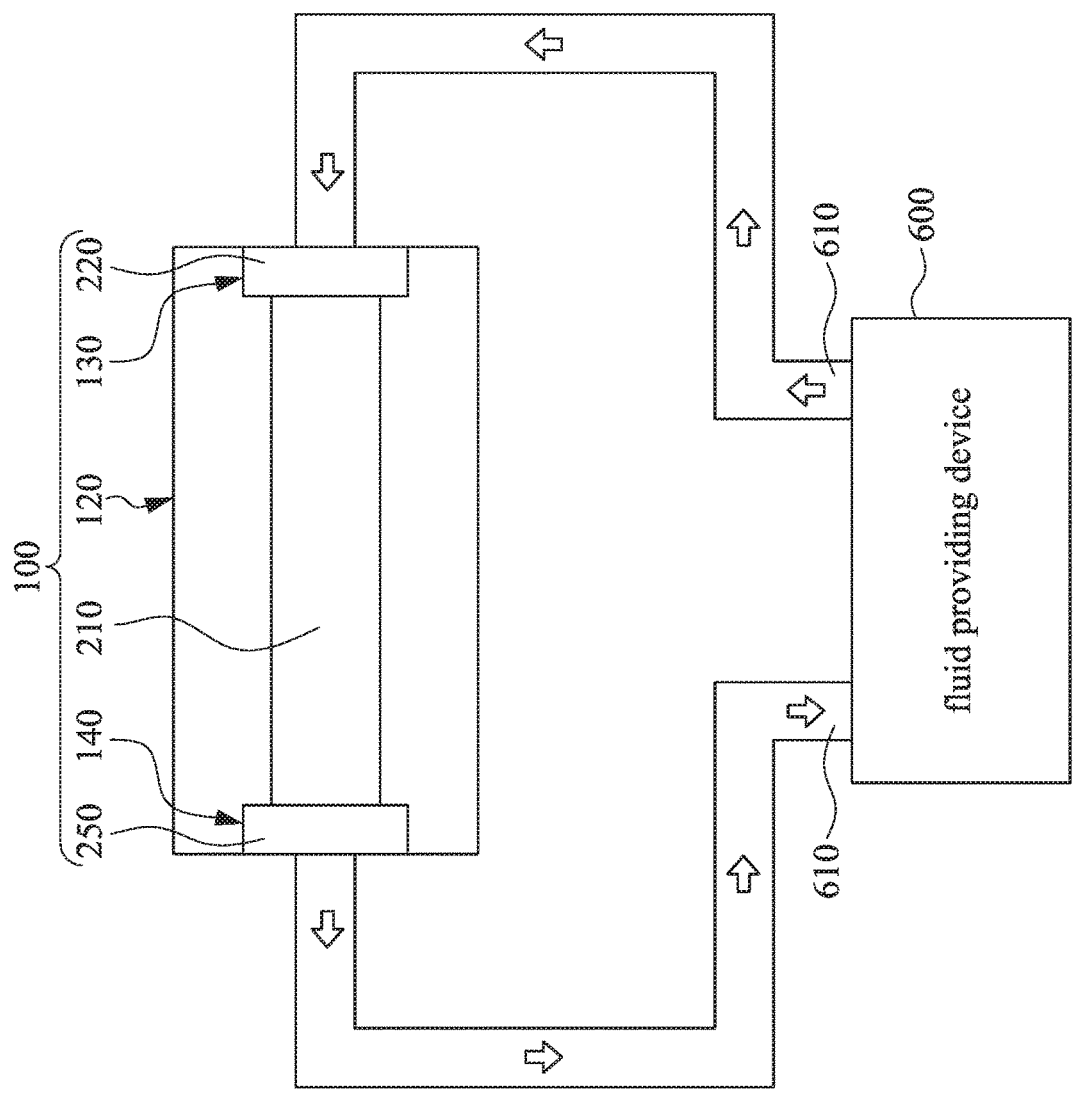
FIG. 6 is a schematic view of the electronic device according to one embodiment of the disclosure.

FIG. 6 is a schematic view of the electronic device 12 according to one embodiment of the disclosure. As shown in FIG. 2 and FIG. 6, the electronic device 12 of the embodiment is substantially the same as the electronic device 10 of the aforementioned embodiment. However, at least one difference of the electronic device 12 of the embodiment from the electronic device 10 is that, the electronic device 12 further includes a fluid providing device 600. The fluid providing device 600 is air-tightly connected to the first slot 130 and the second slot 140 through guide pipes 610. For example, the fluid providing device 600 is air-tightly connected to the first side cover set 220 and the second side cover set 250 through the guide pipes 610.

Thus, when the fluid providing device 600 provides a fluid (e.g., air, water, oil, etc.) to the voids 216 through the first side cover set 220 by one of the guide pipes 610, the fluid takes the thermal energy of the fin set 213 away from the heat guiding base 210 through the second side cover set 250. The fluid is sent back to the fluid providing device 600 from the heat guiding base 210 through another guide pipe 610 so that the fluid providing device 600 receives fluid (e.g., air, water, oil, etc.) returned from the tunnel-type heat dissipation module 200. Therefore, the heat dissipation capability of the electronic device 12 is further enhanced.

The heat-generating source 500 includes, for example, a circuit board 510 and a functional chip 520. The circuit board 510 is fixed on the top surface 111 of the bottom plate 110. The functional chip 520 is soldered on the circuit board 510, and the functional chip 520 generates high temperature during operation. The functional chip 520 is, for example, a central processing unit (CPU) or/and a graphics processing unit (GPU) of a computer, or a processing unit of a trip computer. However, the disclosure is not limited thereto.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A heat dissipation assembly, comprising:
    a bottom plate for loading a heat-generating source;
    an outer cover comprising a cover body, a first slot and a second slot, the cover body covering one surface of the bottom plate so that an accommodation space is mutually defined between the cover body and the bottom plate, and the first slot and the second slot being respectively formed on two opposite sides of the cover body, and in communication with the accommodation space;
    a heat guiding base thermally contacting the heat-generating source and the cover body, and formed with a plurality of voids which are arranged alongside, wherein each of the voids is communication with the first slot and the second slot;
    a first side cover set disposed within the first slot, and detachably connected to the cover body and the heat guiding base, and the first side cover set is formed with a first passage, wherein the first side cover set comprises a first ventilation cover, a first support frame fixed on one side of the heat guiding base, a first elastic inner cushion directly sandwiched between the first support frame and the heat guiding base, and a first elastic outer cushion directly sandwiched between the first ventilation cover and the first support frame;
a second side cover set disposed within the second slot, and detachably connected to the cover body and the heat guiding base, and the second side cover set is formed with a second passage; and
at least one first flow-acceleration unit disposed in the first passage for leading a fluid to the second passage from the first side cover set through the voids, wherein the first support frame is formed with at least one receiving zone for receiving the at least one first flow-acceleration unit, and the first ventilation cover is fixed on the at least one first flow-acceleration unit and the cover body.

2. The heat dissipation assembly of claim 1, wherein the first slot comprises:
a first recessed portion formed on one of the two opposite sides of the cover body; and
a first opening arranged within the first recessed portion, connected to the accommodation space and the first passage, wherein the first side cover set is totally embedded in the first recessed portion, and the first passage is communication with the accommodation space via the first opening.

3. The heat dissipation assembly of claim 1, wherein the heat guiding base comprises:
a base portion in which one surface of the base portion is directly connected to the heat-generating source;
a top cover portion covering another surface of the base portion, and is directly connected to the cover body;
a fin set comprising a plurality of fins which are straightly and arranged abreast on the another surface of the base portion so that the base portion, the top cover portion and the fins mutually define the voids which are arranged alongside, each of the voids is communication with the first passage and the second passage; and
two fixing portions respectively formed on two opposite ends of the fin set for fixing the first side cover set and the second side cover set on the fin set, respectively.

4. The heat dissipation assembly of claim 1, wherein the first support frame comprises:
a frame body disposed between the first elastic outer cushion and the first elastic inner cushion, wherein the at least one receiving zone is concavely formed on the frame body;
an extending portion, comprises:
a main body connected to one surface of the frame body facing towards the heat guiding base;
an abutting surface located on one surface of the main body facing away from the at least one receiving zone for abutting the first elastic inner cushion; and
a guiding sloping surface located on another surface of the main body facing towards the at least one receiving zone for leading the fluid in the first passage to the voids.

5. The heat dissipation assembly of claim 1, wherein the outer cover further comprises:
a narrow groove formed on one surface of the cover body facing away from the bottom plate; and
a through hole formed within the narrow groove, and connected to the narrow groove and the accommodation space, wherein the at least one first flow-acceleration unit comprises a power supply wire, and the power supply wire passes through the through hole to be limited in the narrow groove.

6. The heat dissipation assembly of claim 1, further comprising:
at least one second flow-acceleration unit disposed in the second passage of the second side cover set for leading the fluid in the voids to the second side cover set.

7. An electronic device, comprising:
a bottom plate;
an outer cover comprising a cover body, a first slot and a second slot, the cover body covering one surface of the bottom plate so that an accommodation space is mutually defined between the cover body and the bottom plate, and the first slot and the second slot being respectively formed on two opposite sides of the cover body, and in communication with the accommodation space;
a heat-generating source disposed in the accommodation space, and fixedly disposed on the one surface of the bottom plate;
a tunnel-type heat dissipation module disposed in the accommodation space, the first slot and the second slot, and thermally connected to the heat-generating source, the tunnel-type heat dissipation module comprising a first side cover set, a second side cover set and a heat guiding base between the first side cover set and the second side cover set, the first side cover set disposed within the first slot, and detachably connected to the cover body and the heat guiding base, and the second side cover set that is disposed within the second slot, and detachably connected to the cover body and the heat guiding base,
wherein the first side cover set comprises a first ventilation cover fixed on the cover body, a first support frame fixed on one side of the heat guiding base and formed with at least one receiving zone, a first elastic inner cushion directly sandwiched between the first support frame and the heat guiding base, and a first elastic outer cushion directly sandwiched between the first ventilation cover and the first support frame; and
a fluid providing device air-tightly connected the first slot and the second slot through guide pipes for leading a fluid to the tunnel-type heat dissipation module, and receiving the fluid returned from the tunnel-type heat dissipation module.

8. The electronic device of claim 7, wherein
the heat guiding base is thermally connected to the heat-generating source and the cover body, and formed with a plurality of voids which are arranged alongside, wherein each of the voids is independently communicated with the first slot and the second slot, and hermetically isolated from the heat-generating source, the first side cover set is formed with a first passage, and the second side cover set is formed with a second passage; and
the tunnel-type heat dissipation module further comprises at least one first flow-acceleration unit disposed in the first passage for leading the fluid to the second passage from the first side cover set through the voids.

9. The electronic device of claim 8, wherein the heat guiding base comprises:
a base portion in which one surface of the base portion is directly connected to the heat-generating source;
a top cover portion covering another surface of the base portion, and is directly connected to the cover body;
a fin set comprising a plurality of fins which are straightly and arranged abreast on the another surface of the base portion so that the base portion, the top cover portion and the fins mutually define the voids which are arranged alongside, each of the voids is communication with the first passage and the second passage; and two fixing portions respectively formed on two opposite ends of the fin set for fixing the first side cover set and the second side cover set on the fin set, respectively.

* * * * *